US008946670B1

(12) United States Patent
Park

(10) Patent No.: US 8,946,670 B1
(45) Date of Patent: Feb. 3, 2015

(54) THREE-DIMENSIONAL SEMICONDUCTOR DEVICE, VARIABLE RESISTIVE MEMORY DEVICE INCLUDING THE SAME, AND METHOD OF MANUFACTURING THE SAME

(71) Applicant: SK Hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/075,910

(22) Filed: Nov. 8, 2013

(30) Foreign Application Priority Data

Aug. 19, 2013 (KR) .................. 10-2013-0097816

(51) Int. Cl.
*H01L 29/02* (2006.01)
*H01L 27/24* (2006.01)
*H01L 29/66* (2006.01)
*H01L 29/78* (2006.01)

(52) U.S. Cl.
CPC ...... *H01L 27/2436* (2013.01); *H01L 29/66477* (2013.01); *H01L 29/78* (2013.01)
USPC ........ 257/2; 257/4; 257/5; 257/324; 257/329; 257/E27.103; 257/E29.309; 257/E29.262; 438/238; 438/382

(58) Field of Classification Search
CPC ..... H01L 29/792; H01L 27/115; H01L 45/00; H01L 21/8239; H01L 29/78; H01L 27/24; H01L 21/8234
USPC .......... 257/4, 5, 324, 329, E27.103, E29.309, 257/E29.262, 2; 438/238, 382
See application file for complete search history.

(56) References Cited

U.S. PATENT DOCUMENTS

| 6,881,994 | B2 * | 4/2005 | Lee et al. ....................... | 257/296 |
|---|---|---|---|---|
| 7,714,377 | B2 * | 5/2010 | Specht et al. ................. | 257/316 |
| 8,815,702 | B2 * | 8/2014 | Oh et al. ........................ | 438/424 |
| 2005/0164456 | A1 * | 7/2005 | Deppe et al. .................. | 438/275 |
| 2006/0163631 | A1 * | 7/2006 | Chen et al. ..................... | 257/296 |
| 2008/0160431 | A1 * | 7/2008 | Scott et al. ........................ | 430/5 |
| 2008/0173933 | A1 * | 7/2008 | Fukuzumi et al. ............. | 257/324 |
| 2008/0303096 | A1 * | 12/2008 | Schulz ........................... | 257/365 |
| 2010/0142294 | A1 * | 6/2010 | Carman ......................... | 365/191 |
| 2013/0052805 | A1 * | 2/2013 | Previtali ........................ | 438/478 |
| 2013/0056698 | A1 * | 3/2013 | Satoh et al. ....................... | 257/2 |
| 2013/0153851 | A1 * | 6/2013 | Park ................................ | 257/4 |
| 2014/0113427 | A1 * | 4/2014 | Park ................................. | 438/381 |
| 2014/0166971 | A1 * | 6/2014 | Park ................................ | 257/5 |
| 2014/0239247 | A1 * | 8/2014 | Park ................................. | 257/4 |

FOREIGN PATENT DOCUMENTS

KR    1020040001955    1/2004

* cited by examiner

*Primary Examiner* — Caleb Henry
(74) *Attorney, Agent, or Firm* — IP & T Group LLP

(57) ABSTRACT

A three-dimensional semiconductor device, a resistive variable memory device including the same, and a method of manufacturing the same are provided. The 3D semiconductor device includes a source formed of a first semiconductor material, a channel layer formed on the source and formed of the first semiconductor material, a lightly doped drain (LDD) region formed on the channel layer and formed of a second semiconductor material having a higher oxidation rate than that of the first semiconductor material, a drain formed on the LDD region and formed of the first semiconductor material, and a gate insulating layer formed on outer circumferences of the channel layer, the LDD region, and the drain.

13 Claims, 3 Drawing Sheets

THREE-DIMENSIONAL SEMICONDUCTOR DEVICE, VARIABLE RESISTIVE MEMORY DEVICE INCLUDING THE SAME, AND METHOD OF MANUFACTURING THE SAME

CROSS-REFERENCES TO RELATED APPLICATION

This application claims priority under 35 U.S.C. 119(a) to Korean application No. 10-2013-0097816, filed on Aug. 19, 2013, in the Korean Intellectual Property Office, which is incorporated by reference in its entirety as set forth in full.

BACKGROUND

1. Technical Field

The inventive concept relates to a semiconductor integration circuit device, and, more particularly, to a three-dimensional (3D) semiconductor device, a variable resistive memory device including the same, and a method of manufacturing the same.

2. Related Art

With the rapid development of mobile and digital information communication and consumer-electronic industries, studies on existing electronic charged-controlled devices may encounter limitations. Thus, new and novel functional memory devices other than the existing electronic charged-controlled devices need to be developed. In particular, next-generation memory devices with large capacity, ultra-high speed, and ultra-low power need to be developed to satisfy demands on large capacity of memories in main information apparatuses.

Currently, variable resistive memory devices using a resistance device as a memory medium have been suggested as the next-generation memory devices. Examples of the variable resistive memory devices are phase-change random access memories (PCRAMs), resistance RAMs (ReRAMs), and magneto-resistive RAMs (MRAMs).

Each of the variable resistive memory devices may be formed of a switching device and a resistance device, and may store data "0" or "1" according to a state of the resistance device.

Even in the variable resistive memory devices, a priority is to improve its integration density, that is, to integrate as many memory cells as possible in a limited small area.

To satisfy the priority, the variable resistive memory device employs a three-dimensional (3D) transistor. The 3D transistor is a transistor in which a channel is formed to be perpendicular to a surface of a semiconductor substrate.

D transistor requires a thin gate insulating layer as well. Thus, when a high voltage is supplied to a gate of the 3D transistor, a relatively high electric field is applied to a lightly doped drain (LDD) overlapping the gate, thereby causing gate-induced drain leakage (GIDL).

SUMMARY

According to an exemplary embodiment of the inventive concept, there is provided a three-dimensional (3D) semiconductor device. The 3D semiconductor device may include a source formed of a first semiconductor material, a channel layer formed on the source and formed of the first semiconductor material, a lightly doped drain (LDD) region formed on the channel layer and formed of a second semiconductor material having a higher oxidation rate than that of the first semiconductor material, a drain formed on the LDD region and formed of the first semiconductor material, and a gate insulating layer formed on outer circumferences of the channel layer, the LDD region, and the drain.

According to another exemplary embodiment of the inventive concept, there is provided a variable resistive memory device. The variable resistive memory device may include a semiconductor device including a source formed of a first semiconductor material; a channel layer formed on the source and formed of the first semiconductor material; a lightly doped drain (LDD) region formed on the channel layer and formed of a second semiconductor material having a higher oxidation rate than that of the first semiconductor material; a drain formed on the LDD region and formed of the first semiconductor material; a gate insulating layer formed on outer circumferences of the channel layer, the LDD region, and the drain; and a resistive memory structure electrically coupled to the drain of the transistor.

According to still another exemplary embodiment of the inventive concept, there is provided a method of manufacturing a three-dimensional (3D) semiconductor device. The method may include forming a source on a semiconductor substrate, sequentially forming a first semiconductor layer, a second semiconductor layer, and a third semiconductor layer on the source; patterning the first semiconductor layer, the second semiconductor layer, and the third semiconductor layer to form an active pillar; oxidizing an outer circumference of the active pillar to form a gate insulating layer; and forming a gate on an outer circumference of the gate insulating layer, wherein the second semiconductor layer is formed of a material having a higher oxidation rate than those of the first semiconductor layer and the third semiconductor layer.

According to still another exemplary embodiment of the inventive concept, there is provided a method of manufacturing a variable resistive memory device. The method may include forming a source on a semiconductor substrate, sequentially forming a first semiconductor layer formed of a first material, a second semiconductor layer formed of a second material having a higher oxidation rate than that of the first material, and a third semiconductor layer formed of the first material on the source; patterning the first semiconductor layer, the second semiconductor layer, and the third semiconductor layer; forming a lightly doped drain (LDD) region in the second semiconductor layer and a drain in the third semiconductor layer; oxidizing outer circumferences of the first semiconductor layer, the LDD region and the drain region to form a gate insulating layer; forming a gate on an outer circumference of the gate insulating layer to overlap the first semiconductor layer and a portion of the LDD region; forming a heating electrode on the drain; and forming a variable resistance layer on the heating electrode.

For example, portion of the gate insulating layer, formed on the outer circumference of the second semiconductor layer, may be thicker than portions of the gate insulating layer, formed on the outer circumferences of the first semiconductor layer and the third semiconductor layer.

For example, a portion of the gate insulating layer, formed on the outer circumference of the LDD region, may be thicker than portions of the gate insulating layer, formed on the outer circumferences of the first semiconductor layer and the drain.

These and other features, aspects, and embodiments are described below in the section entitled "DETAILED DESCRIPTION."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
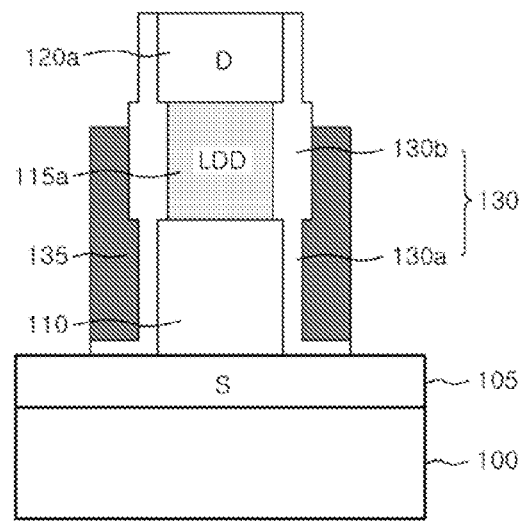
FIG. 1 is a schematic cross-sectional view illustrating a 3D semiconductor device according to an embodiment of the inventive concept.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths, and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

The inventive concept is described herein with reference to cross-section and/or plan illustrations that are schematic illustrations of idealized embodiments of the inventive concept. However, embodiments of the inventive concept should not be construed as limited to the inventive concept. Although a few embodiments of the inventive concept will be shown and described, it will be appreciated by those of ordinary skill in the art that changes may be made in these exemplary embodiments without departing from the principles and spirit of the inventive concept.

Referring to FIG. 1, a 3D semiconductor device may include a source 105, a channel layer 110, an LDD region 115a, a drain 120a, a gate insulating layer 130, and a gate 135.

The source 105 may be formed in an upper portion of a semiconductor substrate 100. The channel layer 110, the LDD region 115a, and the drain 120a may be formed to be sequentially stacked on the source 105 to form an active pillar. The channel layer 110 and the drain 120a may be formed of a first semiconductor material that is the same as a material constituting the source 105, for example, a silicon (Si) material. The LDD region 115a may be formed of a second semiconductor material having a relatively higher oxidation rate than that of the first semiconductor material, for example, a silicon germanium (SiGe) material. Here, the source 105 and the drain 120a may be first conductivity type high concentration impurity regions, and the LDD region 115a may be a first conductivity type low concentration impurity region.

A gate insulating layer 130 may be formed on an outer circumference of the active pillar formed of the channel layer 110, the LDD region 115a, and the drain 120a. The gate insulating layer 130 may be formed through an oxidation method and include a gate insulating layer 130a and gate insulating layer 130b. The gate insulating layer 130b formed on an outer circumference of the LDD region 115a may be formed to be thicker than the gate insulating layer 130a formed on outer circumferences of the channel layer 110 and the drain 120a, according to a material property of the LDD region 115a.

A gate 135 may be formed on an outer circumference of the gate insulating layer 130. The gate 135 may be formed to overlap the channel layer 110 and a portion of the LDD region 115a.

As the gate insulating layer 130b is formed to be relatively thick on the LDD region 115a on which a gate electric field is concentrated, GIDL due to concentration of the electric field may be prevented.

Figure 2:
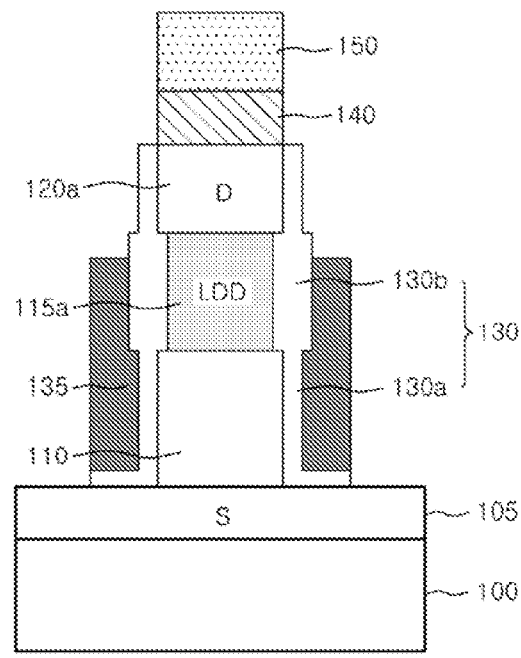
FIG. 2 is a schematic cross-sectional view illustrating a variable resistive memory device according to an embodiment of the Inventive concept.

As illustrated in FIG. 2, when a variable resistive memory device is formed using the semiconductor device of FIG. 1, the variable resistive memory device may include a heating electrode 140 and a storage medium, for example, a variable resistance layer 150, which are sequentially stacked on the drain 120a. The heating electrode 140 may be formed of a doped polysilicon layer or a metal layer including an ohmic layer. The variable resistance layer 150 may include a PCMO layer for a ReRAM, a chalcogenide layer for a PCRAM, a magnetic layer for a MRAM, a magnetization reversal device layer for a spin-transfer torque magnetoresistive RAM (STT-MRAM), and a polymer layer for a polymer RAM (PoRAM). As the variable resistive memory device above is exemplarily described, the semiconductor device of FIG. 1 may be applied to all integrated circuit devices using a vertical semiconductor device.

Hereinafter, methods of manufacturing the 3D semiconductor device of FIG. 1 and the variable resistive memory device including the 3D semiconductor device of FIG. 2 will be described.

Figure 3:
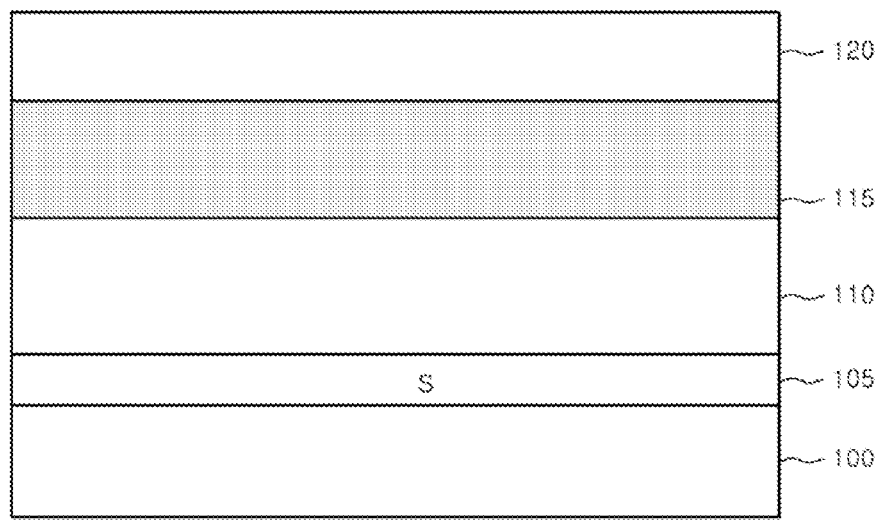
FIGS. 3 to 6 are cross-sectional views illustrating a method of manufacturing a 3D semiconductor device according to an embodiment of the inventive concept.

Referring to FIG. 3, a semiconductor substrate 100 is prepared. The semiconductor substrate 100 may be formed of a first semiconductor material, for example, a Si material. A source (S) 105 may be formed in an upper portion of the semiconductor substrate 100. The source 105 may be formed by implanting high concentration impurities in a predetermined region of the semiconductor substrate 100. For example, the source 105 may be formed in a line shape, and is may have a common source structure to which sources of a plurality of semiconductor devices are commonly coupled. A conductivity type of impurity may be changed according to a type of semiconductor device.

A first semiconductor layer 110, a second semiconductor layer 115, and a third semiconductor layer 120 may be sequentially deposited on the semiconductor substrate 100 in which the source 105 is formed. The first semiconductor layer 110 and the third semiconductor layer 120 may be formed of the first semiconductor material that is substantially the same as the material of the semiconductor substrate 100, and the second semiconductor layer 115 may be formed of a second semiconductor material that is different from the first semiconductor material. For example, the second semiconductor material may include a material having a higher oxidation rate than that of the first semiconductor material. In the embodiment, each of the first and third semiconductor layers 110 and 120 may be formed of a silicon layer, and the second semiconductor layer 115 may be formed of a SiGe layer. The first to third semiconductor layers 110, 115, and 120 may be formed, for example, through an epitaxial growth method. For example, the first semiconductor layer 110 may be formed to have a thickness corresponding to a level of an expected channel length, the second semiconductor layer 115 may be formed to have a thickness corresponding to a level of an expected LDD depth, and the third semiconductor layer 120 may be formed to have a thickness corresponding to a level of an expected drain depth.

Figure 4:
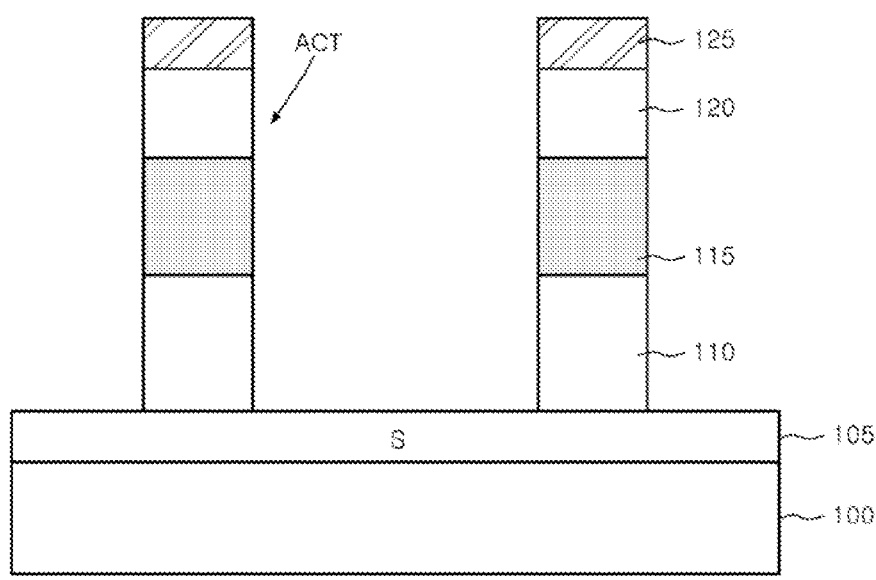

Referring to FIG. 4, a hard mask layer 125 for defining an active region may be formed on the third semiconductor layer 120. The hard mask layer 125 may be formed of, for example, a silicon nitride layer. A photoresist pattern other than the hard mask layer 125 may be used.

The third, second, and first semiconductor layers 120, 115, and 110 are sequentially patterned using the hard mask layer 125 as a mask pattern to define an active pillar ACT.

Figure 5:
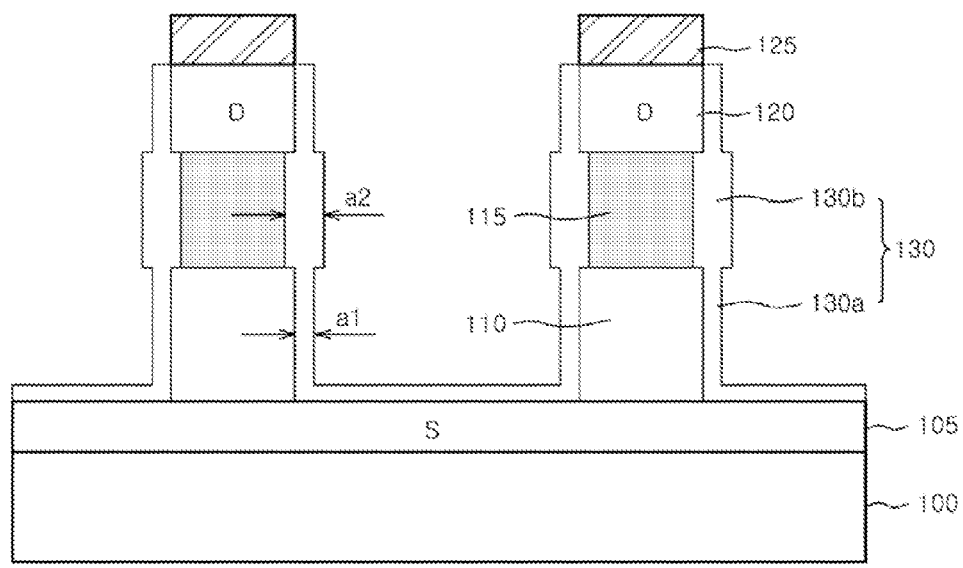

Referring to FIG. 5, an exposed side of the active pillar ACT is oxidized to form a gate insulating layer 130. As described above, since the oxidation rate of the second semiconductor layer 115 is higher than those of the first and third semiconductor layers 110 and 120, a side of the second semiconductor layer 115 is more oxidized than sides of the first and third semiconductor layers 110 and 120. Therefore, the gate insulating layer 130b formed in the side of the second semiconductor layer 115 may be formed to have a thickness larger than that of the gate insulating layer 130a formed in the sides of the first and third semiconductor layers 110 and 120. Here, the reference numeral a1 may denote a thickness of the gate insulating layer 130a, and a2 may denote a thickness of the gate insulating layer 130b. Through the oxidation process, the width of the second semiconductor layer 115 may be more reduced than those of the first and third semiconductor layers 110 and 120.

Figure 6:
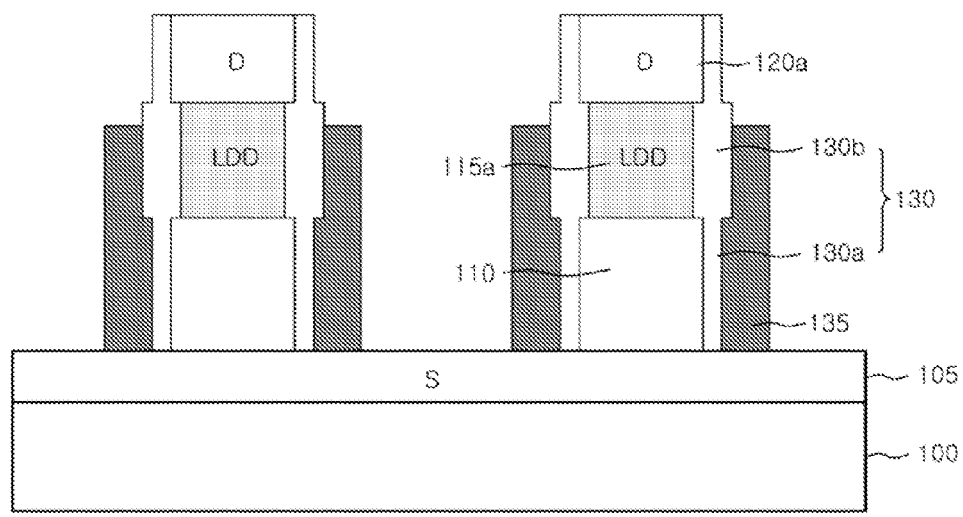

Referring to FIG. 6, the hard mask layer 125 referenced in FIG. 5 is removed through a general method. A conductive layer is deposited on a surface of the resulting structure on the semiconductor substrate 100, in which the gate insulating layer 130 is formed, and then etched to form a gate 135 surrounding an outer circumference of the active pillar ACT. The gate 135 may be formed through an anisotropic over etching method, and an over etching amount may be controlled so that an upper surface of the gate 135 is located lower than an upper surface of the second semiconductor layer 115 referenced in FIG. 5. The conductive layer for the gate 135 may include, for example, various conductive layers in addition to a transition metal layer such as a titanium (Ti) layer, a tantalum (Ta) layer, a cobalt (co) layer, or a platinum (Pt) layer. Through the anisotropic over etching process, the gate oxide layer 130 left in a surface of the source 105 may be removed.

Next, low concentration impurities are implanted into the second semiconductor layer 115 referenced in FIG. 5 to form an LDD region 115a, and high concentration impurities are implanted into the third semiconductor layer 120 referenced in FIG. 5 to form a drain 120a. The impurities for forming the LDD region 115a and the impurities for forming the drain 120a may have the same conductivity type as those for forming the source 105. The first semiconductor layer 110 serves as a channel layer, so it is also referred to as the channel layer 110.

The process of forming the LDD region 115a and the process of forming the drain 120a may be performed between the forming of the active pillar ACT and the forming of the gate insulating layer 130, or between the forming of the gate insulating layer 130 and the forming of the gate 135.

Next, referring back to FIG. 2, the heating electrode 140 and the variable resistance layer 150 may be sequentially formed on the drain 120a in a stacking manner to complete a variable resistive memory device.

According to the embodiment, after an LDD region on which a gate electric field is concentrated is formed of a material having a relatively higher oxidation rate than those of a channel layer and a drain, a gate insulating layer is formed on outer circumferences of the LDD region, the channel layer and the drain, through an oxidation process. Since the gate insulating layer on the outer circumference of the LDD region is formed relatively thicker than the gate insulating layer on the outer circumferences of the channel layer and the drain, without a separate process, an electric field between the drain and the gate, which is generated around the LDD region, may be reduced and thus leakage current due to GIDL may be reduced.

The above embodiment of the present invention is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A three-dimensional (3D) semiconductor device, comprising:
    a source formed of a first semiconductor material;
    a channel layer formed on the source and formed of the first semiconductor material;
    a lightly doped drain (LDD) region formed on the channel layer and formed of a second semiconductor material having a higher oxidation rate than that of the first semiconductor material;
    a drain formed on the LDD region and formed of the first semiconductor material; and
    a gate insulating layer formed on outer circumferences of the channel layer, the LDD region, and the drain.

2. The 3D semiconductor device of claim 1, wherein the first semiconductor material is silicon.

3. The 3D semiconductor device of claim 2, wherein the second semiconductor material is silicon germanium (SiGe).

4. The 3D semiconductor device of claim 1, wherein a portion of the gate insulating layer, formed on the outer circumference of the LDD region, is thicker than portions of the gate insulating layer, formed on the outer circumferences of the channel layer and the drain.

5. The 3D semiconductor device of claim 1, further comprising a gate formed to surround an outer circumference of the gate insulating layer.

6. The 3D semiconductor device of claim 5, wherein the gate is formed to overlap the channel layer and a portion of the LDD region.

7. A variable resistive memory device, comprising:
    a semiconductor device including a source formed of a first semiconductor material, a channel layer formed on the source and formed of the first semiconductor material, a lightly doped drain (LDD) region formed on the channel layer and formed of a second semiconductor material having a higher oxidation rate than that of the first semiconductor material, a drain formed on the LDD region and formed of the first semiconductor material, and a gate insulating layer formed on outer circumferences of the channel layer, the LDD region, and the drain; and
    a resistive memory structure electrically coupled to the drain of the semiconductor device.

8. The variable resistive memory device of claim 7, wherein the first semiconductor material is silicon.

9. The variable resistive memory device of claim 8, wherein the second semiconductor material is silicon germanium (SiGe).

10. The variable resistive memory device of claim 7, wherein a portion of the gate insulating layer, formed on the outer circumference of the LDD region, is thicker than portions of the gate insulating layer, formed on the outer circumferences of the channel layer and the drain.

11. The variable resistive memory device of claim 10, wherein the semiconductor device further includes a gate formed on an outer circumference of the gate insulating layer, wherein the gate is formed to overlap the channel layer and a portion of the LDD region.

12. The variable resistive memory device of claim 8, wherein the resistive memory structure includes:
   a heating electrode formed on the drain; and
   a resistance variable layer formed on the heating electrode.

13. The variable resistive memory device of claim 12, wherein the resistance variable layer includes one selected from the group consisting of a PCMO layer for a resistive random access memory (ReRAM), a chalcogenide layer for a phase-change RAM (PCRAM), a magnetic layer for a magnetic RAM (MRAM), a magnetization reversal device layer for a spin-transfer torque magnetoresistive RAM (STTM-RAM), and a polymer layer for a polymer RAM (PoRAM).

* * * * *